(12) United States Patent  
Shimizu

(10) Patent No.: US 11,127,561 B2  
(45) Date of Patent: Sep. 21, 2021

(54) COOLING APPARATUS FOR CHARGED PARTICLE BEAM DEVICE

(71) Applicant: JEOL Ltd., Tokyo (JP)

(72) Inventor: Masashi Shimizu, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 17/069,915

(22) Filed: Oct. 14, 2020

(65) Prior Publication Data

US 2021/0110993 A1 Apr. 15, 2021

(30) Foreign Application Priority Data

Oct. 15, 2019 (JP) .............................. JP2019-188313

(51) Int. Cl.
*H01J 37/00* (2006.01)
*H01J 37/26* (2006.01)
*F28F 3/12* (2006.01)

(52) U.S. Cl.
CPC .............. *H01J 37/261* (2013.01); *F28F 3/12* (2013.01)

(58) Field of Classification Search
USPC ..................................................... 250/443.1
See application file for complete search history.

(56) References Cited

U.S. PATENT DOCUMENTS

| 5,126,571 A * | 6/1992 | Sakai .................. H01J 37/3171 250/443.1 |
| 7,211,806 B2 * | 5/2007 | Muller .................... H01J 37/20 250/311 |
| 8,853,648 B2 * | 10/2014 | Nagakubo .............. G01N 1/286 250/443.1 |
| 10,403,534 B2 * | 9/2019 | Parkhe ................ H01L 21/6833 |
| 10,541,158 B2 * | 1/2020 | Sasaki ............... H01L 21/67109 |
| 2005/0092013 A1 * | 5/2005 | Emoto ................ G03F 7/70691 62/304 |
| 2011/0147609 A1 * | 6/2011 | Shichi ................... H01J 27/022 250/400 |

FOREIGN PATENT DOCUMENTS

| JP | H9306405 A | 11/1997 |
| JP | 10149791 A | 6/1998 |
| JP | 200046452 A | 2/2000 |
| WO | 2010001910 A1 | 1/2010 |

OTHER PUBLICATIONS

Extended European Search Report issued in EP20200126.9 dated Mar. 1, 2021.

* cited by examiner

*Primary Examiner* — Phillip A Johnston
(74) *Attorney, Agent, or Firm* — The Webb Law Firm

(57) ABSTRACT

A secondary storage container is a member which surrounds a primary storage container. A vaporized coolant generated in a primary storage space flows into and is stored in the secondary storage container. Radiant heat is blocked by the secondary storage container in a cooled state. Heat transferred to the primary storage container is reduced by a heat conducting path including the secondary storage container.

7 Claims, 5 Drawing Sheets

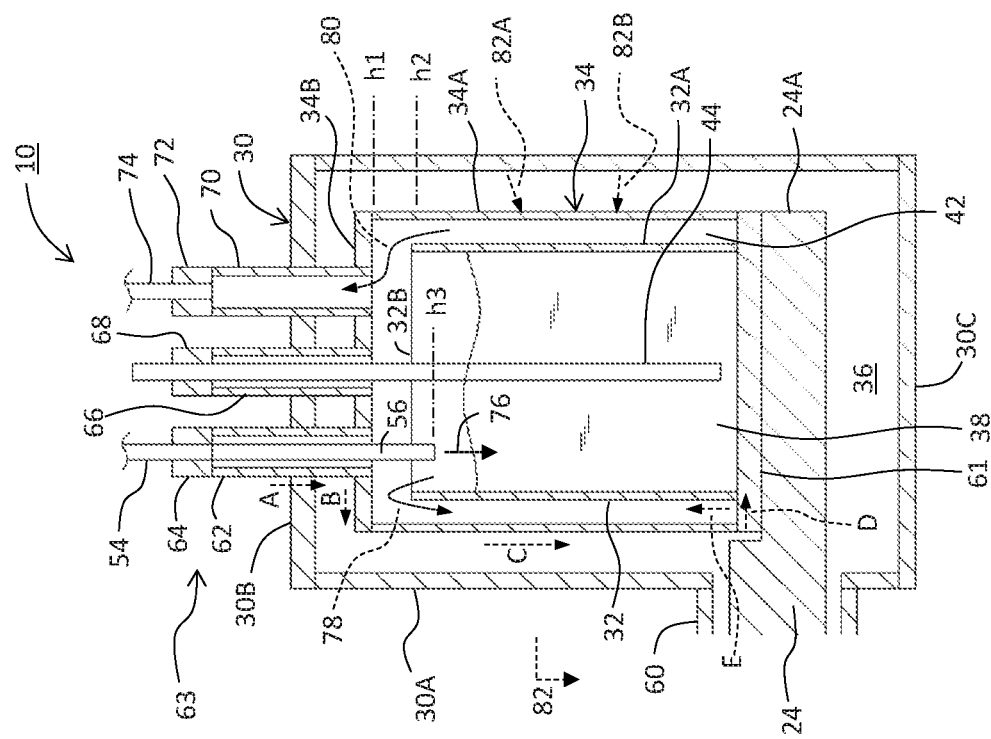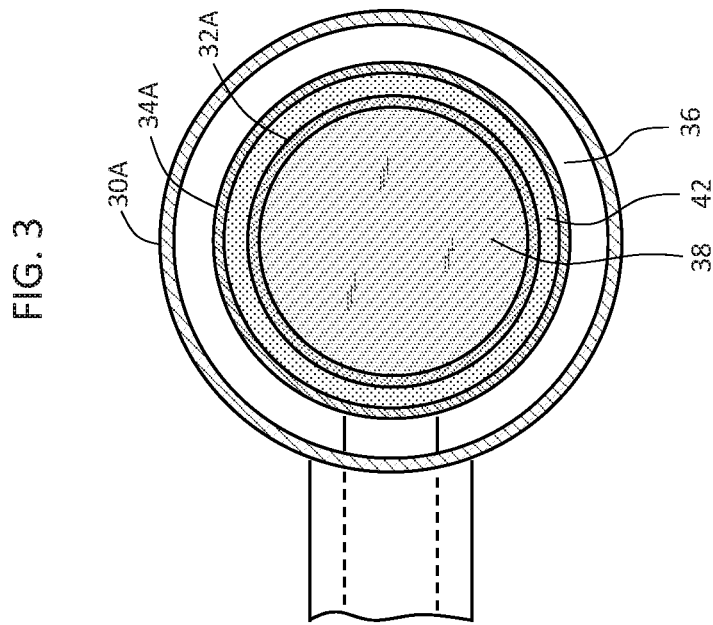

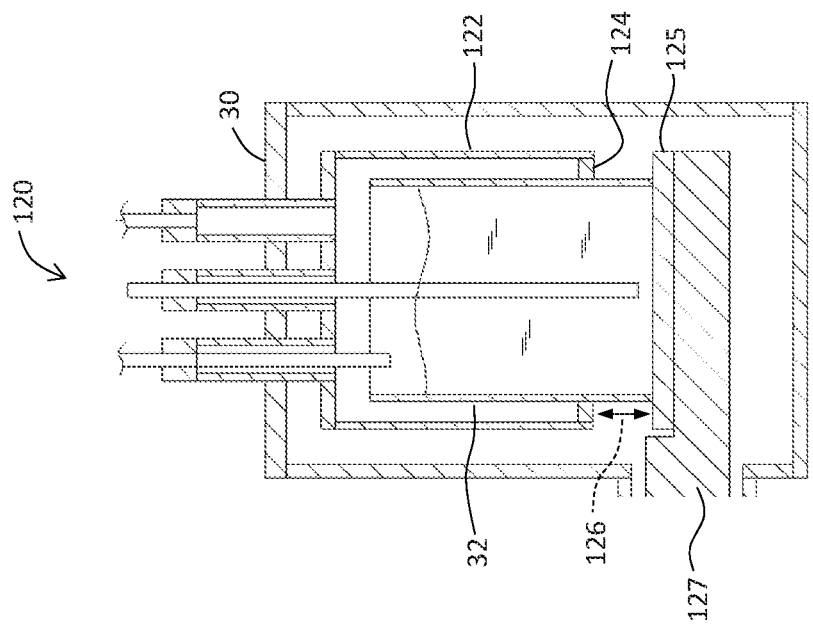

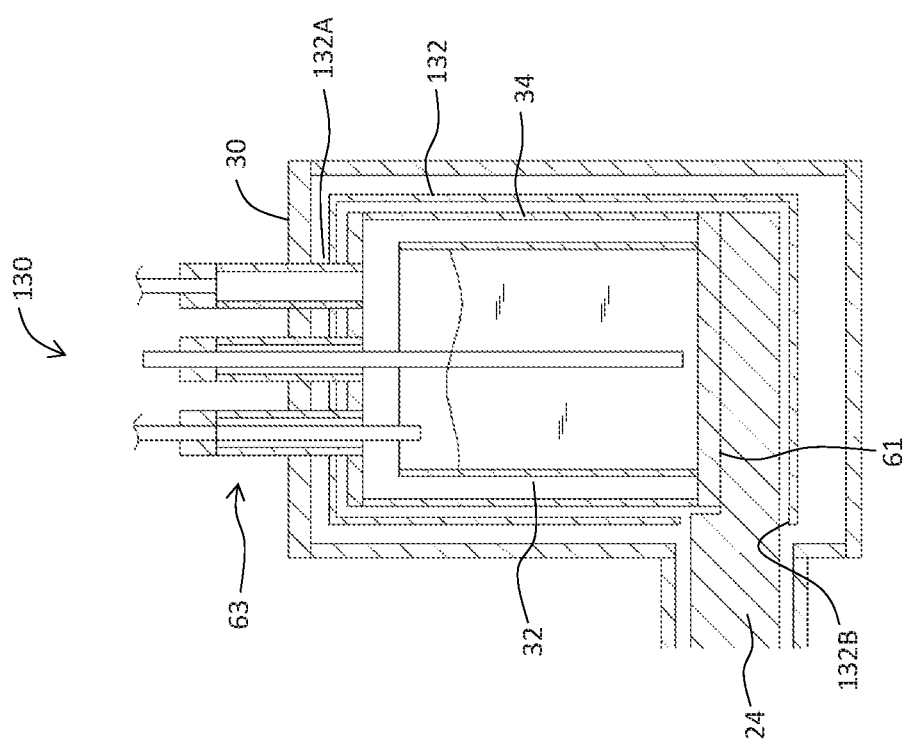

COOLING APPARATUS FOR CHARGED PARTICLE BEAM DEVICE

CROSS REFERENCE TO RELATED APPLICATION

This application claims priority to Japanese Patent Application No. 2019-188313 filed on Oct. 15, 2019, the disclosure of which is hereby incorporated by reference in its entirety.

BACKGROUND OF THE INVENTION

Field of the Invention

The present disclosure relates to a cooling apparatus for a charged particle beam device, and in particular to a structure of a cooling apparatus which stores a liquid coolant.

Description of Related Art

As a charged particle beam device, there are known a transmission electron microscope, a scanning electron microscope, an ion beam irradiation device, and the like. In the charged particle beam device, when a sample which is a target of observation, analysis, or machining must be cooled, a cooling apparatus is used.

For example, in the transmission electron microscope, a sample which is held by a sample holder is cooled by a cooling system. The cooling system is formed from a cooling apparatus which functions as a heat exchange device, a heat conductive member connected to the cooling apparatus, or the like. The heat conductive member is connected to a member which holds the sample or to a member which surrounds the sample.

In general, the cooling apparatus includes a storage container which stores a liquid coolant, and a housing which houses the storage container, and an internal space of the housing is set to vacuum (for example, refer to JP H10-149791 A). At an upper part of the storage container, a plurality of pipes are connected, and the housing holds the storage container via the plurality of pipes. The liquid coolant is, for example, liquid nitrogen, liquid helium, or the like.

In a cooling apparatus for a charged particle beam device, when a large amount of heat is transferred to the storage container which stores the liquid coolant, the liquid coolant in the storage container is vigorously vaporized and evaporated. That is, bubbling is caused. A vibration caused by the bubbling significantly affects an operation of the charged particle beam device. In order to suppress the bubbling, inflow of heat from the outside to the liquid coolant must be reduced to a maximum possible extent. From the viewpoint of reducing an amount of consumption of the liquid coolant also, reduction, to a maximum possible extent, of the heat inflow from the outside to the liquid coolant is desired.

SUMMARY OF THE INVENTION

An advantage of the present disclosure lies in reduction of heat inflow to the stored liquid coolant, in the cooling apparatus for the charged particle beam device.

According to one aspect of the present disclosure, there is provided a cooling apparatus for a charged particle beam device, the cooling apparatus comprising: a primary storage container that has a primary storage space which stores a liquid coolant; a secondary storage container that surrounds the primary storage container; a housing that houses the primary storage container and the secondary storage container; and a heat conductive member that is connected to the primary storage container and that transfers heat for cooling a sample which is irradiated with a charged particle beam, wherein a secondary storage space which stores a vaporized coolant generated by vaporization of the liquid coolant is provided between the primary storage container and the secondary storage container.

BRIEF DESCRIPTION OF DRAWINGS

Embodiment(s) of the present disclosure will be described based on the following figures, wherein:

FIG. 2 is a vertical cross-sectional diagram showing the cooling apparatus according to the first embodiment of the present disclosure;

FIG. 3 is a horizontal cross-sectional diagram showing the cooling apparatus according to the first embodiment of the present disclosure;

FIG. 5 is a vertical cross-sectional diagram showing a cooling apparatus according to a second embodiment of the present disclosure; and FIG. 6 is a vertical cross-sectional diagram showing a cooling apparatus according to a third embodiment of the present disclosure.

DESCRIPTION OF THE INVENTION

Figure 1:
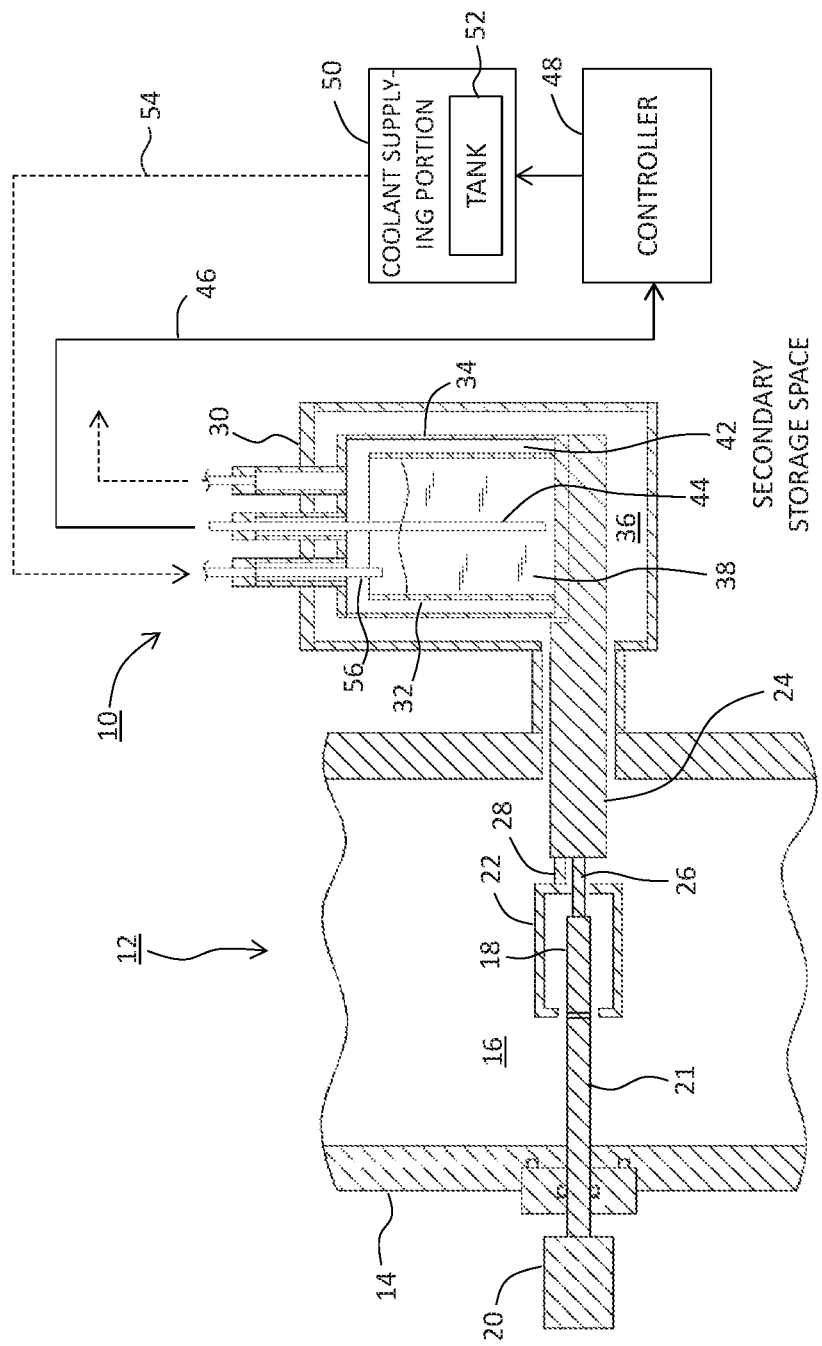
FIG. 1 is a vertical cross-sectional diagram showing a transmission electron microscope equipped with a cooling apparatus according to a first embodiment of the present disclosure.

Embodiments of the present disclosure will now be described with reference to the drawings.

(1) Overview of Embodiments

A cooling apparatus for a charged particle beam device according to an embodiment of the present disclosure comprises a primary storage container, a secondary storage container, a housing, and a heat conductive member. The primary storage container has a primary storage space which stores a liquid coolant. The secondary storage container has a form surrounding the primary storage container. The housing is a casing which houses the primary storage container and the secondary storage container. The heat conductive member is a member which is connected to the primary storage container, and which transfers heat for cooling a sample which is irradiated with a charged particle beam. A secondary storage space which stores a vaporized coolant generated by vaporization of the liquid coolant is provided between the primary storage container and the secondary storage container.

According to the structure described above, because the secondary storage space is provided between the primary storage container and the secondary storage container; that is, inside the secondary storage container, the vaporized coolant generated in the primary storage space moves from the primary storage space to the secondary storage space, and is accumulated in the secondary storage space. The secondary storage container is cooled at all times by the vaporized coolant. Because a temperature of the vaporized coolant generated in the primary storage space is close to a temperature of the liquid coolant, a state can be formed in which the primary storage container is wrapped with a low-temperature bracket. Radiant heat from the outside flows into the liquid coolant in the primary storage container via such a low-temperature bracket. Because of this configuration, heat inflow to the liquid coolant can be suppressed.

In an embodiment of the present disclosure, the secondary storage container is provided surrounding the primary storage container. When a bottom is provided in the secondary storage container, the vaporized coolant can be naturally stored inside the secondary storage container. Alternatively, a configuration may be employed in which the bottom is not provided in the secondary storage container, and the vaporized coolant is stored or circulated in the secondary storage container. Alternatively, a configuration may be employed in which the secondary storage space is provided at a lower side of the primary storage space or extends to the lower side of the primary storage space. In an embodiment of the present disclosure, an inside space of the housing is a vacuum space. As the charged particle beam device, a transmission electron microscope, a scanning electron microscope, an ion beam irradiation apparatus, and the like may be exemplified.

In an embodiment of the present disclosure, the primary storage container is thermally connected to the housing via the secondary storage container. According to this configuration, a heat conducting path from the housing to the primary storage container can be elongated, and a heat absorbing portion may be provided on the heat conducting path, so that the heat inflow to the primary storage container is reduced.

In an embodiment of the present disclosure, the housing holds an upper part of the secondary storage container, and a lower part of the secondary storage container is connected to a lower part of the primary storage container. In this configuration, the primary storage container is held by the housing via the secondary storage container. An upper part of the primary storage container is in an isolated state in which the upper part does not contact any structure at a periphery thereof.

According to the structure described above, the heat transferred from the housing to the upper part of the secondary storage container is transferred from the upper part of the secondary storage container to the lower part of the secondary storage container, and then from the lower part of the secondary storage container to the lower part of the primary storage container. Because the vaporized coolant exists in the secondary storage container and the secondary storage container itself is in a quite cooled state; that is, because the heat is absorbed by the vaporized coolant in the secondary storage container, the heat inflow to the liquid coolant in the primary storage container is reduced. In the secondary storage space, the vaporized coolant which becomes lighter by absorbing the heat naturally ascends, and is finally discharged to the outside. In place of the discharged vaporized coolant, cold vaporized coolant generated in the primary storage space flows into the secondary storage space. These actions take place simultaneously. With such a configuration, the secondary storage container is put in a cold state at all times.

In an embodiment of the present disclosure, the cooling apparatus further comprises a common bottom plate that functions as a bottom plate of the primary storage container and as a bottom plate of the secondary storage container. The common bottom plate is connected to the heat conductive member. The common bottom plate defines a bottom of the secondary storage space. According to this configuration, a number of components of the cooling apparatus can be reduced. In addition, a heat conducting efficiency can be improved.

In an embodiment of the present disclosure, the cooling apparatus further comprises an introduction pipe that introduces the liquid coolant to the primary storage space. A level of a lower end opening of the introduction pipe is lower than a level of an upper opening of the primary storage container. According to this configuration, entrance of the liquid coolant into the secondary storage container can be prevented.

In an embodiment of the present disclosure, the cooling apparatus further comprises a discharge pipe that discharges a vaporized coolant ascending from the secondary storage space. The discharge pipe is connected to the secondary storage container while being separated from the primary storage container. In an embodiment of the present disclosure, the cooling apparatus further comprises a radiation shield provided between the secondary storage container and the housing. According to this configuration, inflow of the radiant heat to the primary storage container can be further reduced.

(2) Details of Embodiments

FIG. 1 shows a transmission electron microscope 12 equipped with a cooling apparatus 10 according to a first embodiment of the present disclosure. Alternatively, the cooling apparatus 10 may be equipped in other charged particle beam devices.

The transmission electron microscope 12 has a lens barrel 14. In a sample chamber 16 of the lens barrel, there is provided a sample holder 18 which holds a sample which is an observation target. The sample holder 18 is held by a holding mechanism 20. More specifically, the sample holder 18 is held by an arm 21 of the holding mechanism 20. Inside of the lens barrel 14 is vacuum. That is, the sample chamber 16 is a vacuum chamber.

When the sample is a biological sample or the like, the sample is set in a cooled state. An apparatus for cooling the sample is the cooling apparatus 10. A shield 22 is a member which surrounds the sample holder 18. Radiant heat is blocked by the shield 22. A heat conductive member 24 formed from a hard material having a superior heat conductance (for example, copper) is provided between the sample holder 18 and the cooling apparatus 10. The heat conductive member 24 has, for example, a rod-shape form.

A heat conductive member 26 which is flexible is provided between a tip end of the heat conductive member 24 and the sample holder 18. In addition, a heat conductive member 28 which is flexible is provided between the tip end of the heat conductive member 24 and the shield 22. Each of the heat conductive members 26 and 28 is formed from a soft material having a superior heat conductance (for example, a silver foil). On the shield 22, there are formed an incidence opening and an emission opening for allowing electron beams to pass through. When viewed from above, a central axis of the heat conductive member 24 and a central axis of the arm 21 cross each other.

The cooling apparatus 10 will now be described. A housing 30 has a circular tubular shape. An inside space 36 of the housing 30 is vacuum. In the housing 30, a primary storage container 32 having a circular tubular shape is placed, and a secondary storage container 34 having a circular tubular shape is placed wrapping or surrounding the primary storage container 32. The primary storage container 32 functions as a liquid coolant container. An inside space of the primary storage container 32 is a primary storage space 38, and the liquid coolant is stored therein. The liquid coolant is, for example liquid nitrogen. A liquid surface sensor 44 is placed along a center axis of the primary storage space 38. The liquid surface sensor 44 has a heat insulating structure, and there is only a very little heat conduction via the liquid surface sensor 44.

The secondary storage container 34 is a container which stores a vaporized coolant. The secondary storage container 34 functions as a vaporized coolant container. An inside space of the secondary storage container 34 is a secondary storage space 42. In other words, a gap between the primary storage container 32 and the secondary storage container 34 is the secondary storage space 42. The liquid coolant is evaporated and vaporized in the primary storage space 38, and the vaporized coolant is generated. The vaporized coolant flows from an upper part of the primary storage space 38 into the secondary storage space 42 provided at a periphery of the primary storage space 38. The vaporized coolant having a temperature increased (that is, having a weight reduced) due to radiant heat or the like in the secondary storage space 42 ascends in the secondary storage space 42, and flows out to the outside. In place of the vaporized coolant which has flowed out, cold vaporized coolant from the primary storage space 38 flows into the secondary storage space 42. These actions take place simultaneously.

A detection signal from the liquid surface sensor 44 is sent via a signal line 46 to a controller 48. The controller 48 controls supply of the liquid coolant based on the detection signal. More specifically, the controller 48 controls an operation of a coolant supplying portion 50 having a tank 52. The tank 52 is a supply source of the liquid coolant. The liquid coolant from the liquid coolant supplying portion 50 is sent via a pipe 54 to the cooling apparatus 10.

Next, a structure and an operation of the cooling apparatus 10 will be described in detail with reference to FIG. 2. As described above, the cooling apparatus 10 comprises the housing 30, the primary storage container 32, and the secondary storage container 34. The inside space of the primary storage container 32 is the primary storage space 38, and the inside space of the secondary storage container 34 is the secondary storage space 42. The primary storage space 38 is a circular column-shape space which stores the liquid coolant, and the secondary storage space 42 is an annular space which stores the vaporized coolant. The primary storage container 32 and the primary storage space 38 are surrounded by the secondary storage space 42 except for a bottom portion.

More specifically, the housing 30 is formed from, for example, a metal such as stainless steel, and includes a body 30A having a circular tubular shape, a ceiling wall 30B having a circular disk shape, and a bottom wall 30C having a circular disk shape. The body 30A is connected to an outer end of a hollow connection member 60. An inside space of the connection member 60 and the inside space 36 of the housing 30 are connected to each other. An inner end of the connection member 60 is connected to an outer wall of the lens barrel 14.

The secondary storage container 34 is formed from, for example, a metal such as stainless steel or copper, and includes a body 34A and a ceiling wall 34B. In the present embodiment, the body 34A and the ceiling wall 34B are formed from stainless steel. A common bottom plate 61 has a circular disk shape, and functions as a bottom wall of the secondary storage container 34. The common bottom plate 61 is formed from a material having a superior heat conductance (for example, copper).

The primary storage container 32 is formed from a material having a superior heat conductance (for example, copper), and includes a body 32A and an opening 32B. The common bottom plate 61 functions as a bottom wall of the primary storage container 32. The body 32A has a tubular shape, and the opening 32B is circular. The primary storage container 32 is enclosed in the secondary storage container 34. As described above, the bottom walls of the primary and secondary storage containers 32 and 34 are integrated.

An upper structure 63 connects the housing 30 and the secondary storage container 34. In other words, the housing 30 holds the secondary storage container 34 (and the primary storage container 32) via the upper structure 63. The secondary storage container 34 holds the primary storage container 32 or the like. In summary, the housing 30 holds the secondary storage container 34, the common bottom plate 61, the primary storage container 32, and the heat conductive member 24 via the upper structure 63.

The upper structure 63 has tubular members 62, 66, and 70. These tubular members 62, 66, and 70 penetrate through and are fixed on the ceiling wall 30B of the housing 30. Lower ends of the tubular members 62, 66, and 70 are connected to the ceiling wall 34B of the secondary storage container 34.

The pipe 54 passes inside the tubular member 62, and a nozzle 56 is formed at a lower end portion of the pipe 54. A cap 64 is provided on the tubular member 62, and holds the pipe 54. A lower end opening (ejection port) of the nozzle 56 passes through the opening 32B of the primary storage container 32, and extends to the inside of the primary storage space 38. This configuration prevents entry of the liquid coolant into the secondary storage space 42 during ejection (refer to reference numeral 76) of the liquid coolant by the nozzle 56.

The liquid surface sensor 44 is a rod-shaped member, and passes inside the tubular member 66. A cap 68 is provided on the tubular member 66, and holds the liquid surface sensor 44. The tubular member 70 functions as a port for discharging the vaporized coolant. A cap 72 is provided on the tubular member 70, and a pipe 74 is connected to the cap 72. Each of the tubular members 62, 66, and 70 is formed from, for example, a metal such as stainless steel. Alternatively, each of the caps 64, 68, and 72 may be formed from a material having a superior heat insulating characteristic.

As already described, intermediate portions of the three tubular member 62, 66, and 70 are fixed on the ceiling wall 30B of the housing 30, and the lower ends of the three tubular members 62, 66, and 70 are fixed on the ceiling wall 34B of the secondary storage container 34. With this configuration, the housing 30 holds the secondary storage container 34 and the primary storage container 32. Here, the housing 30 itself does not contact the secondary storage container 34. A vacuum layer exists between the housing 30 and the secondary storage container 34. Main portions (portions other than a bottom portion) of the primary storage container 32 are separated from peripheral structures, and are in a non-contact state with these structures.

The common bottom plate 61 is fixed to an end 24A of the heat conductive member 24. In reality, the heat conductive member 24 is held by the housing 30 via the secondary storage container 34 by this fixation. In this manner, the housing 30 supports all of the structures which are inside the housing 30 via the upper structure 63.

In FIG. 2, h1 shows a level of the ceiling of the secondary storage space 42, h2 shows a level of the opening of the primary storage container 32, and h3 shows a level of the ejection opening of the nozzle 56. These parameters are in a relationship of h1>h2>h3. When the liquid coolant is vaporized in the primary storage container 32 and the vaporized coolant is thereby generated, as shown by reference numeral 78, the vaporized coolant flows over an upper edge of the body 32A of the primary storage container 32, and into the secondary storage space 42 in the secondary storage container 34. In the secondary storage space 42, vaporized coolant which is heated by the radiant heat or conducted heat and which thus becomes lighter ascends. In place of the heated and lightened vaporized coolant, cold and heavy vaporized coolant from the primary storage space 38 flows into the secondary storage space 42. As shown by reference numeral 80, the ascended vaporized coolant flows through an upper side in the secondary storage container 34, and into the tubular member 70, and is discharged via the pipe 74 to the outside. Alternatively, a backflow prevention valve which prevents entry of the atmospheric air may be provided on the pipe 74. According to this configuration, generation of frost or ice due to inflow of the atmospheric air can be prevented.

Thus, in the secondary storage space 42, the cold vaporized coolant is accumulated at all times. The secondary storage container 34 itself is put in a low-temperature state. With respect to radiant heat 82A and 82B, the secondary storage container 34 (and the secondary storage space 42) functions as a blocking member or an absorbing member of the radiant heat, and prevents the radiant heat 82A and 82B from directly reaching the primary storage container 32. In addition to the body 34A, the ceiling wall 34B also realizes the radiant heat blocking function.

As shown by arrows A, B, C, D, and E, the heat of the outside flows into the ceiling wall 34B of the secondary storage container 34 via the upper structure 63. The heat is transferred from the ceiling wall 34B to the body 34A, and then from the body 34A via the common bottom plate 61 to the body 32A of the primary storage container 32. In this manner, because a heat conducting path with a fold-back is formed and a heat absorbing portion is present in the midway thereof, an amount of heat inflow due to heat conduction to the primary storage container becomes very small. Alternatively, a plurality of fold-backs may be provided on the heat conducting path.

As described, the secondary storage container 34 and the secondary storage space 42 function as a low-temperature bracket, from the viewpoint of radiation. The secondary storage container 34 and the secondary storage space 42 function as a heat absorbing element from the viewpoint of heat conduction. In the present embodiment, the liquid surface sensor 44 is provided, and the controller controls the amount of supply of the liquid coolant based on the detection signal from this sensor. Thus, overflow of the liquid coolant from the primary storage container 32 can be prevented. Because direct heat inflow with respect to the upper part of the primary storage container 32 is avoided, even when a relatively large amount of liquid coolant is introduced into the primary storage container 32, bubbling does not tend to be caused. As a result, the cooling capability of the cooling apparatus 10 can be significantly improved.

FIG. 3 shows a cross section shown in FIG. 2 by reference numeral 82. Specifically, a multiplexed structure of concentric circles, including the body 30A of the housing, the body 34A of the secondary storage container, and the body 32A of the primary storage container, is shown. The inside of the body 32A is the primary storage space 38, the inside of the body 34A is the secondary storage space 42, and the inside space 36 of the body 30A is a vacuum space.

Figure 4:
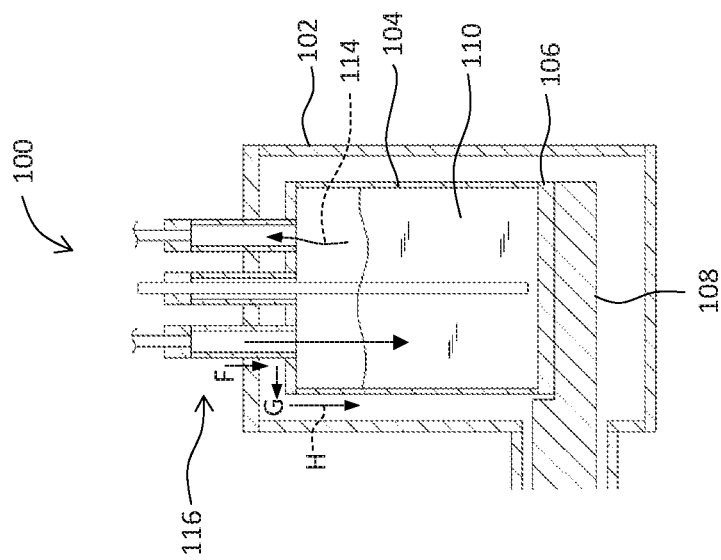
FIG. 4 is a vertical cross-sectional diagram showing a cooling apparatus according to a comparative example.

FIG. 4 shows a cooling apparatus 100 according to a comparative example. A storage container 104 is provided in a housing 102. The housing 102 holds the storage container 104 via an upper structure 116. A bottom wall 106 of the storage container 104 is connected to a heat conductive member 108. An inside space of the storage container 104 is a storage space 110 which stores a liquid coolant. A vaporized coolant generated by vaporization in the storage space is pushed out from the storage space to the outside, as shown by reference numeral 114.

According to the structure of the comparative example, radiant heat from the housing 102 can easily reach the storage container 104. In addition, as shown by arrows F, G, and H, the heat is directly transferred to the storage container 104 via the upper structure 116. With this configuration, bubbling tends to be easily caused in the storage container 104. In particular, the bubbling tends to be easily caused when a relatively large amount of liquid coolant is introduced into the storage container 104. In addition, in this case, an amount of consumption of the liquid coolant becomes large.

On the contrary, according to the cooling apparatus of the first embodiment shown in FIGS. 1 to 3, with the secondary storage container and the secondary storage space, the heat transferred to the liquid coolant in the primary storage container can be significantly reduced in comparison to the comparative example, and the bubbling can be effectively suppressed. At the same time, the amount of consumption of the coolant is reduced.

FIG. 5 shows a cooling apparatus 120 according to a second embodiment of the present disclosure. Elements which are already described are assigned the same reference numerals and their descriptions will not be repeated. This is similarly applicable to FIG. 6 to be described next.

In FIG. 5, a secondary storage container 122 is provided in a manner to wrap the primary storage container 32, in the housing 30. A bottom wall 124 of the secondary storage container 122 is fixed at an intermediate position of the primary storage container 32. That is, the secondary storage container 122 does not extend to a bottom plate 125, and the secondary storage container 122 and the bottom plate 125 do not contact each other. Reference numeral 126 shows a gap between the secondary storage container 122 and the bottom plate 125.

According to this configuration, although entry of the radiant heat to the primary storage container 32 via the gap 126 is of a concern, the direct heat transfer to a heat conductive member 127 via the secondary storage container 122 can be avoided.

FIG. 6 shows a cooling apparatus 130 according to a third embodiment of the present disclosure. In the housing 30, the primary storage container 32 is provided, and the secondary storage container 34 is provided wrapping the primary storage container 32. A circular tubular radiation shield 132 is provided between the secondary storage container 34 and the housing 30. The radiation shield 132 wraps an entirety of the secondary storage container 34 in a non-contacting manner. The radiation shield 132 is formed from, for example, copper. As shown by reference numeral 132A, the radiation shield 132 is fixed to and held by the upper structure 63. An opening 132B is formed at a lower part of the radiation shield 132, and the heat conductive member 24 passes through the opening 132B in a non-contacting manner.

According to the third embodiment, the radiant heat reaching the secondary storage container 34 can be reduced, and, consequently, along with the radiant heat blocking action of the secondary storage container 34, the radiant heat reaching the primary storage container 32 can be significantly reduced. While the lower part of the radiation shield 132 may be connected to the heat conductive member 24, by employing a non-contacting configuration, the heat transferred to the heat conductive member 24 can be reduced.

According to the embodiments described above, heat inflow due to radiation and heat inflow due to heat conduction to the liquid coolant in the primary storage container can be effectively suppressed. Because the bubbling in the primary storage container can be reduced, the problem of vibration due to the bubbling can be resolved or reduced. As a consequence, performance of the charged particle beam device can be maintained or improved. Moreover, the amount of consumption of the liquid coolant can be reduced. Alternatively, the above-described cooling apparatus may be provided for devices other than the charged particle beam device. For example, the above-described cooling apparatus may be provided on an NMR measurement device.

The invention claimed is:

1. A cooling apparatus for a charged particle beam device, the cooling apparatus comprising:
    a primary storage container that has a primary storage space which stores a liquid coolant;
    a secondary storage container that surrounds the primary storage container;
    a housing that houses the primary storage container and the secondary storage container; and
    a heat conductive member that is connected to the primary storage container and that transfers heat for cooling a sample which is irradiated with a charged particle beam, wherein
    a secondary storage space which stores a vaporized coolant generated by vaporization of the liquid coolant is provided between the primary storage container and the secondary storage container.

2. The cooling apparatus for charged particle beam device according to claim 1, wherein
    the primary storage container is thermally connected to the housing via the secondary storage container.

3. The cooling apparatus for charged particle beam device according to claim 2, wherein
    the housing holds an upper part of the secondary storage container,
    a lower part of the secondary storage container is connected to a lower part of the primary storage container, so that the primary storage container is held by the housing via the secondary storage container, and
    an upper part of the primary storage container is in an isolated state in which the upper part does not contact any structure at a periphery thereof.

4. The cooling apparatus for charged particle beam device according to claim 3, further comprising:
    a common bottom plate that functions as a bottom plate of the primary storage container and as a bottom plate of the secondary storage container, wherein
    the common bottom plate is connected to the heat conductive member, and
    the common bottom plate defines a bottom of the secondary storage space.

5. The cooling apparatus for charged particle beam device according to claim 3, further comprising:
    an introduction pipe that introduces the liquid coolant to the primary storage space, wherein
    a level of a lower end opening of the introduction pipe is lower than a level of an upper opening of the primary storage container.

6. The cooling apparatus for charged particle beam device according to claim 3, further comprising:
    a discharge pipe that discharges the vaporized coolant ascending from the secondary storage space, wherein
    the discharge pipe is connected to the secondary storage container while being separated from the primary storage container.

7. The cooling apparatus for charged particle beam device according to claim 1, further comprising:
    a radiation shield provided between the secondary storage container and the housing.

* * * * *